United States Patent [19]

Greene

[11] Patent Number: 4,499,481
[45] Date of Patent: Feb. 12, 1985

[54] HETEROJUNCTION SCHOTTKY GATE MESFET WITH LOWER CHANNEL RIDGE BARRIER

[75] Inventor: Richard F. Greene, Bethesda, Md.

[73] Assignee: The United States of America as represented by the Secretary of the Navy, Washington, D.C.

[21] Appl. No.: 532,122

[22] Filed: Sep. 14, 1983

[51] Int. Cl.³ .............................................. H01L 29/80
[52] U.S. Cl. ....................................... 357/22; 357/15; 357/16; 357/20
[58] Field of Search ....................... 357/16, 55, 15, 22, 357/22 S, 20, 23.4, 22 P

[56] References Cited

U.S. PATENT DOCUMENTS

| | | |
|---|---|---|
| 4,077,111 | 3/1978 | Driver et al. |
| 4,145,459 | 3/1979 | Goel |
| 4,156,879 | 5/1979 | Lee |
| 4,173,063 | 11/1979 | Kniepkamp et al. |
| 4,189,737 | 2/1980 | Schrader et al. |
| 4,325,181 | 4/1982 | Yoder |
| 4,336,549 | 6/1982 | Ladd, Jr. |
| 4,424,525 | 1/1984 | Mimura ................................ 357/15 |

OTHER PUBLICATIONS

Mok et al. "The Characteristics and Applications of a V-Shaped Notched-Channel Field-Effect Transistor (VFET)" Solid State Electronics, vol. 19, p. 159, (1976).

Primary Examiner—Joseph E. Clawson, Jr.
Assistant Examiner—Terri M. Henn
Attorney, Agent, or Firm—Robert F. Beers; William T. Ellis

[57] ABSTRACT

An FET with an extremely short channel formed by the apex of a substrate ridge structure protruding upward through the channel layer toward a Schottky-barrier gate contact. The device is formed by etching a modulation-doped substrate to form an upwardly protruding ridge with the apex modulation-doped. A semiconductor layer is then disposed over the substrate surface with the protruding ridge to obtain an epitaxial interface therebetween. Source and drain regions are doped into the semiconductor layer on opposite sides of the ridge structure. Finally, ohmic contacts are formed on the semiconductor layer over the source and drain regions and a Schottky-barrier metalization is deposited on the semiconductor layer above the ridge structure. This device has a very short channel, a low transit time, a low gate capacitance, and an enhanced transconductance.

11 Claims, 7 Drawing Figures

NORMALLY ON AT POSITIVE BIAS

NORMALLY ON AT POSITIVE BIAS

NEGATIVE BIAS-CHANNEL PINCHED OFF

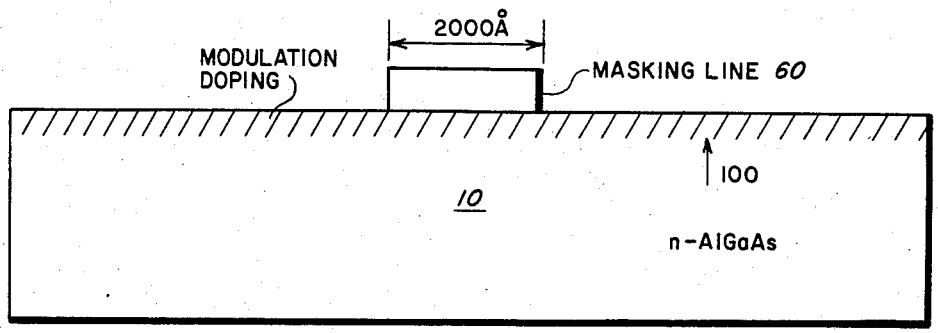
LITHOGRAPHIC FORMATION
OF RIDGE
FIG. 3(a)
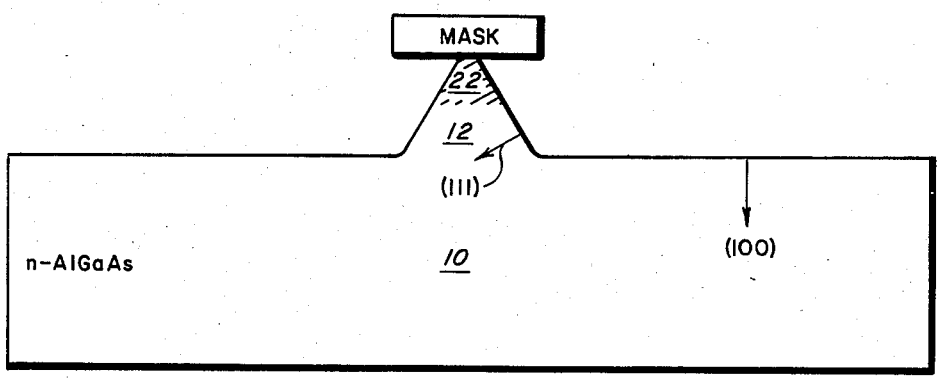
O.D ETCHING OF RIDGE
FIG. 3(b)
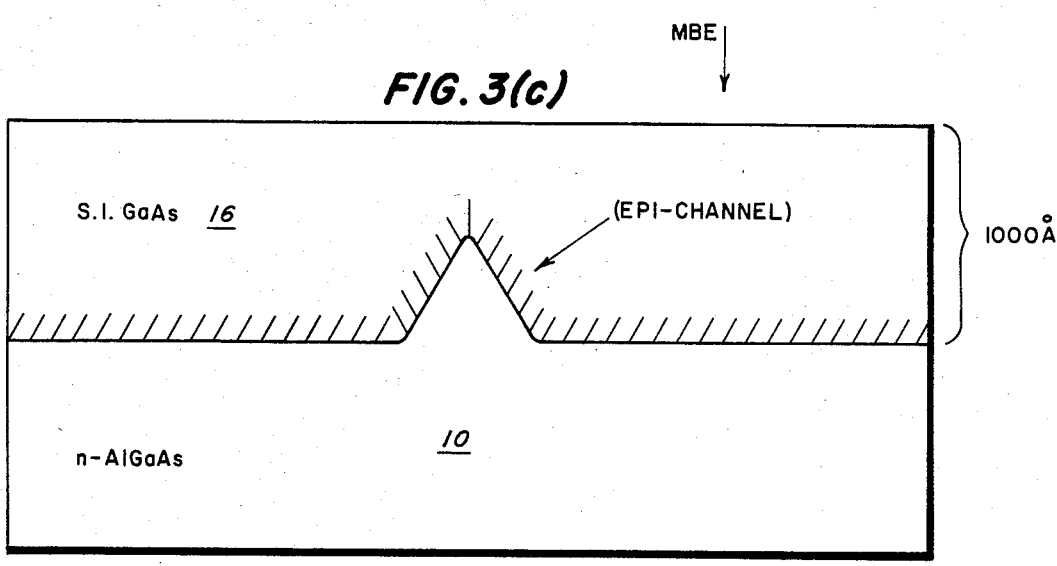
MBE EPITAXIAL OVERGROWTH OF GaAs

ION INPLANT FORMATION OF SOURCE AND DRAIN

SOURCE & DRAIN OHMIC CONTACTS AND GATE SCHOTTKY B.

HETEROJUNCTION SCHOTTKY GATE MESFET WITH LOWER CHANNEL RIDGE BARRIER

BACKGROUND OF THE INVENTION

The present invention relates generally to semiconductor switching devices, and more particularly, to very fast field-effect transistors.

Field effect transistors have been known for many years and have been found to be especially suitable for high frequency switching operations. In this regard, such state of the art FET's as the Fujitsu HEMT have switching times on the order of 10-20 picoseconds. These high switching times are the result of forming the FET channel in GaAs formed on an adjacent substrate of AlGaAs. The GaAs/AlGaAs interface is an epitaxial heterojunction interface which allows the carriers in the GaAs channel to move with low scattering rates due to the high geometric atomic order of that interface. The AlGaAs substrate is doped in order to provide carriers for the FET channel. However, a problem when using such donor substrates is that when the charged carriers propagate into the FET channel, the donor atoms remaining in the substrate have a charge of the opposite type to that of the donated carrier. In the case of an n-doped substrate, the corresponding donor atoms remaining in the substrate will all have a positive charge. This positive charge in the substrate atoms adjacent to the FET channel causes the electrons flowing in that channel to scatter. This scattering caused by the charge on the substrate donors can be avoided by the modulation doping of the substrate layers immediately adjacent to the FET channel. This modulation doping simply comprises forming the last 50-100 angstroms of the substrate with neutral or non-doped material. In essence, the donor scattering is almost totally avoided by buffering the charged donor atoms in the substrate with an undoped region.

Although the forgoing modulation doped state of-the-art FET has a fast switching time, the FET channel is relatively long, leading to an inherent speed limitation in the device. Furthermore, the dynamic range of the device is limited by the fixed pinning of the energy bands at the GaAs/AlGaAs interface. Accordingly the transconductance, i.e. the change of drain current caused by a change in gate voltage, is inherently limited because it depends on the ohmic resistance between the source and the gate region of the FET. This ohmic resistance, in turn, is directly related to the physical length of the channel path. Attempts to reduce this channel length by bringing the source and the drain physically closer have resulted in significantly increased capacitive coupling between those electrodes. Such coupling results in the shorting out of the gate voltage at high switching rates.

OBJECTS OF THE INVENTION

Accordingly, it is an object of the present invention to significantly decrease the switching time of a semiconductor switching device.

It is a further object of the present invention to provide a low power switching device compatible with solid state fabrication technology with switching times in the one-to-ten picosecond region.

It is a further object of the present invention to provide a semiconductor switching device with a very short channel and a low transit time.

It is yet a further object of the present invention to provide a semiconductor switching device with a low gate capacitance and a low RC time constant.

It is a further object of the present invention to significantly increase the transconductance of a semiconductor switching device.

Other objects, advantages, and novel features of the present invention will become apparent from the detailed description of the the invention, which follows the summary.

SUMMARY OF THE INVENTION

Briefly, the present invention comprises a semiconductor switching device including in combination: a doped semiconductor substrate with one surface thereof being approximately flat, but with a ridge structure rising from a portion of this flat surface; a semiconductor layer disposed over the flat surface and ridge structure of the substrate to form an epitaxial heterojunction interface therewith. Heavily doped source and drain regions are then disposed in the semiconductor layer on opposite sides of the ridge structure. Source and drain ohmic contacts are then disposed on the semiconductor layer above the source and drain regions and a gate material is disposed on the semiconductor layer above the substrate ridge structure to form the gate contact.

In a preferred embodiment of the present invention, the ridge structure is modulation-doped in the area around the apex of the ridge structure. This ridge structure typically may take an approximate V-shape. An additional feature of the preferred embodiment of this device is that the gate material is a Schottky-barrier material.

BRIEF DESCRIPTION OF THE DRAWINGS

FIG. 3 (b) illustrates the resultant ridge structure after the etching step for the present invention.

FIG. 3 (c) illustrates the MBE epitaxial overgrowth of the GaAs.

FIG. 3 (d) illustrates the device after ion implantation to form the source and drain regions.

FIG. 3 (e) illustrates the resulting device of the present invention and sets forth example dimension therefore.

DETAILED DESCRIPTION OF THE PREFERRED EMBODIMENT

The present invention discloses a very high speed switching device with switching times in the 10 picosecond region. These very fast switching times are achieved by etching a modulation doped substrate to form an upwardly protruding ridge with its apex modulation-doped. A semiconductor layer is then disposed over the substrate surface with the protruding ridge to obtain an epitaxial interface there between. These features in combination with the standard doped source and drain regions yield an extremely fast FET.

Figure 1:
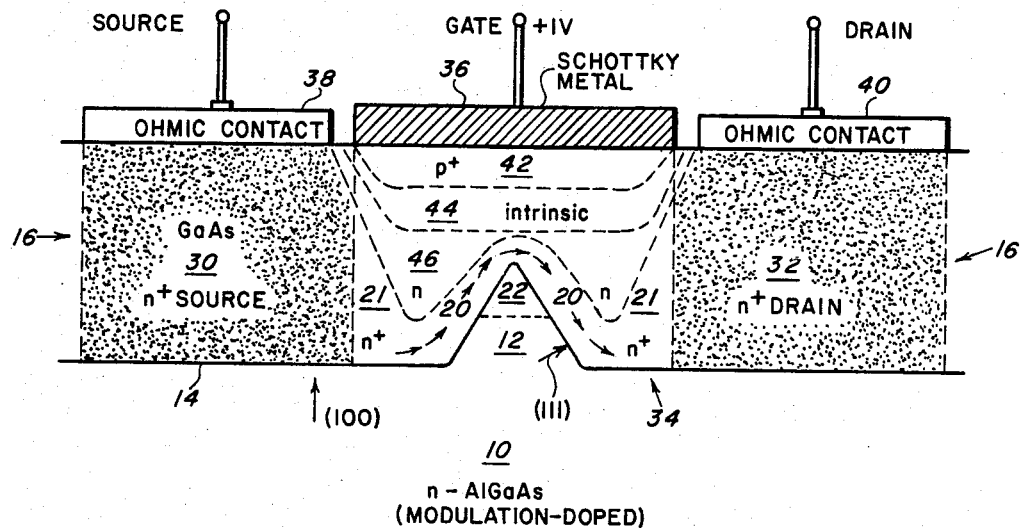
FIG. 1 is a sectioned side view of the semiconductor switching device of the present invention with a positive bias.

Referring now to the drawings, wherein like reference characters designate like or corresponding parts throughout the views, FIG. 1 shows one embodiment of the present invention. The switching device comprises a doped substrate 10 with a ridge 12 rising up from one surface 14 thereof, and including a semiconductor layer 16 disposed over this substrate surface 14 including the ridge 12. A variety of semiconductor material combinations for the substrate 10 and the semiconductor layer 16 can be utilized. The major requirement for the material is that an epitaxial heterojunction interface be formed at the interface surface 14. In the examples shown in FIG. 1, the substrate 10 is formed from n-doped AlGaAs with (100) orientation and the semiconductor layer 16 is formed from GaAs, also with a (100) orientation. The ridge faces are (111) planes.

The epitaxial heterojunction interface formed at the surface 14 provides an abrupt change in band structure between the two materials. This abrupt change or transition in the band structure tends to confine the carriers in the GaAs semiconductor layer 16. Specifically, the conduction band in the AlGaAs is at a higher energy level than the conduction band for the GaAs thus providing a natural barrier to electron carriers propagating from the GaAs into the AlGaAs. Since the AlGaAs donor levels are above the GaAs conduction band minimum, electron carrier transfer occurs across the heteroepitaxial interface from the AlGaAs into the GaAs to form a channel 21. These electron carriers in this channel path 21 feel an attractive positive potential from the donor atoms from which they came, but the electrons cannot propagate past the abrupt heterostructure interface. Accordingly, these electrons remain in the channel region 20 above the heterostructure interface to form an n+ region.

The fact that the interface between the substrate 10 and the semiconductor layer 16 is epitaxial in nature means that the spacing in the crystals in the one material fit exactly the spacing of the atoms or molecules in the other crystal material, i.e. they are in register. Thus, electrons can flow parallel to the AlGaAs/GaAs boundary without being scattered by any crystal lattice defects at the interface. Also, as noted previously, the substrate 10 acts to provide donor carriers to the GaAs semiconductor layer 16 without the scattering from damage centers normally present in standard nonepitaxial interfaces.

As noted above, the heterojunction barrier produced between the two different materials contains atomic patterns which are in fully ordered registry across the interface. Thus the heterojunction barrier is abrupt and atomically smooth leading to abrupt pinch-off. This abrupt pinch-off leads to higher transconductance and to higher switching speeds. This abrupt heterojunction is in marked contrast to standard homojunctions. Such homojunctions may have an abrupt doping profile but cannot have an abrupt potential change due to the thermal diffusion of carriers hundreds of angstroms away from the junction to yield a smooth potential gradient.

As noted previously, donor materials which give up a charged carrier retain a charge of the opposite sign at that position in the lattice in the substrate material. For n-doped AlGaAs 10, the donation of electrons therefrom into the GaAs layer 16 leaves a layer of donor atoms with positive charges thereon. As noted previously, the charge on this layer of donor atoms causes scattering of the negatively charged electron carriers in the layer 16 thereby impeding their flow therein. This donor scattering problem is obviated by modulation doping the doped substrate 10 in the area adjacent to the carrier channel in the layer 16. In the present design, the region of primary interest is the arrowed path 20 which follows the profile of the upwardly protruding ridge 12. Accordingly, it is desired to modulation-dope the substrate ridge material following the interface between the GaAs layer 16. In the embodiment FIG. 1, the portion 22 at the very apex of the ridge 12 is modulated doped. In essence, the portion 22 contains undoped material so that the negatively charged electron carriers flowing along the path 20 are not repelled and scattered by any donors contained in this region. This undoped buffer layer 22 effectively changes the speed of the carriers at small source drain voltages by a significant amount (up to several hundred percent).

The semiconductor switching device of FIG. 1 comprises an FET structure disposed on the aforementioned doped AlGaAs substrate 10. The FET is formed in the semiconductor GaAs layer 16. More specifically, the area 30 is heavily doped to form the source region. The area 32 is heavily doped to form the drain region. Typically, this doping may be accomplished by the ion implantation of n+ dopants. The central area 34 between the source 30 and the drain 32 contains the n+ channel region 21 through which the typical current path 20 threads. This channel region 21 is disposed to follow the profile of the ridge structure 12.

The gate electrode is formed by disposing gate material 36 on top of the semiconductor layer 16 directly above the ridge structure 12. This gate material may be such as to form either a Schottky barrier or a junction gate. In a preferred embodiment, the gate electrode 36 is formed from a Schottky barrier metalization. Ohmic metalizations 38 and 40 are then disposed over the source region 30 and the drain region 32, respectively to provide low resistance source and drain contacts.

As noted previously, the speed of the semiconductor switching device is directly related to the channel length in the region 34. The insertion of the ridge structure 12 up into the channel region significantly reduces the size of the operating channel. Such structure has only been used in the past in the form of V shaped gates protruding down into the channel from the top of the device. In this regard, see "The Characteristics and Applications of A V Shaped Notched-Channel Field-Effect Transistor (VFET)" by T. D. Mok and C. A. T. Salama, Solid State Electronics, 1976, Vol. 19, pp. 159–166, Pergamon Press; U.S. Pat. No. 4,156,879 entitled "Passivated V-Gate GAAS Field-Effect Transistors" by D. H. Lee.

In comparison, the present design permits the fabrication of the source and drain somewhat closer than in Mok et al. Moreover, the present design utilizes heavily-doped high conductivity regions 30 and 32 as the source and drain. Because these source and drain regions 30 and 32 extend down into the semiconductor layer 16, they significantly decrease the required current path in the device and the attendant access resistance, thereby decreasing the switching time. The foregoing features in combination with the modulation-doped epitaxial heterojunction interface between the semiconductor layer 16 and the substrate 10 (which provides the carriers while obviating the donor scattering problem) significantly increase the switching speed. In essence, the high conductivity regions 30 and 32 fit smoothly on and connect with the n+channel path region 21 formed by the heteroepitaxial interface, thereby reducing the resistance. Note also that the abrupt change in the conduction band level at this epitaxial heterojunction interface compared to the pn junction of Mok et al. also produces a much more abrupt pinch off with gate voltage and hence a much higher transconductance.

Figure 2:
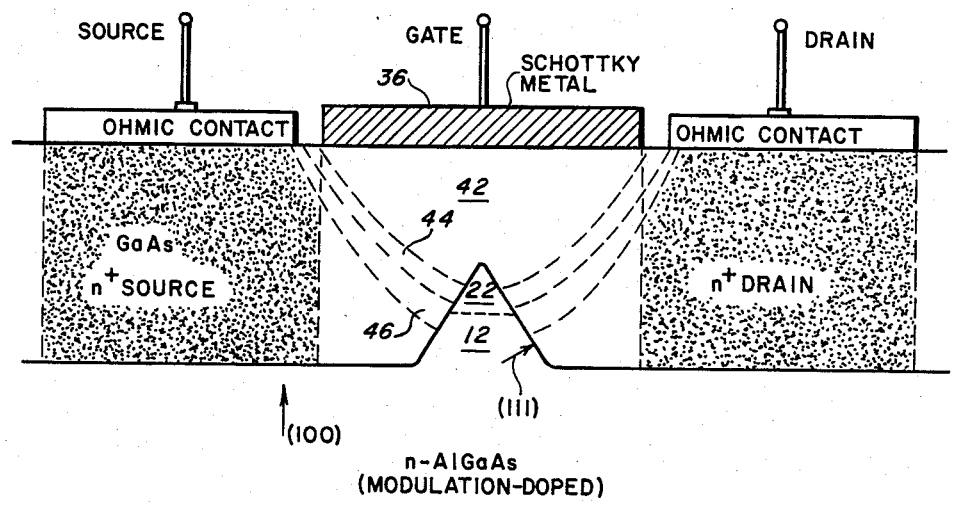
FIG. 2 is a sectioned side view of the device of FIG. 1 with a negative bias on the gate to a achieve a pinch off condition.

The device of FIG. 1 is shown with a plus one voltage on the Schottky gate electrode 36. Such a voltage bias on the gate will result in a depletion region 42 (p+) directly below the gate electrode with virtually no electron carriers therein, a depletion layer 44 (intrinsic) directly below the depletion layer 42 with a very few electron carriers therein, and a depletion layer 46 (n) directly below depletion layer 44 containing a greater number of electron carriers therein. The channel path region 21 is n+ because of the heteroepitaxial interface and provides the path for the electrons to flow from the source 30 following the profile of the ridge 12 around the apex region 22 to the drain 32. It can be seen that the critical narrow channel section is the path 20 around the apex area 22 of the ridge 12. When this short section 20 is opened, i.e. there are a significant number of electron carriers therein, then the switch will be open. Likewise, when a voltage is applied to increase the area of the depletion layers 42, 44, and 46 to envelop the ridge apex 22, then the switch is off. This situation is shown in FIG. 2 for a negative bias on the gate electrode 36. It can be seen that the depletion layer 42 with virtually no electron carriers therein completely envelopes the very top of the apex area 22. Accordingly, with this negative bias the channel region is pinched off.

Because this critical channel region 20 is so short, the operating speed of the switching device is significantly enhanced. This speed enhancement is unexpectedly high due to the modulation-doped (non-doped) region 22 at the apex of the ridge structure 12. Accordingly, there are no donor atoms in the lattice containing positive charges in the region 22. Thus, there is no electron scattering by the charges on the donors in this region.

It should also be noted that the transconductance is significantly enhanced because of the sharp ridge enhancement of the electric field from the gate bias voltage across to the ridge. This ridge enhancement leads to a much larger change in the voltage at the ridge than at a flat surface. In this regard, the voltage changes logarithmically with distance from the ridge.

Typically, the present switching device is biased with a negative voltage which allows the Schottky barrier region to touch the apex of the ridge 12. Thus, the device is switched off with this bias except for a small leakage current past the ridge. A plus one voltage applied to the gate opens the short channel whose length in the present example is the radius of the ridge edge, approximately 200 angstroms, plus twice the screening length which can be fixed at approximately 400 angstroms by the choice of the GaAs carrier concentration. In the example shown in FIG. 1, the carrier concentration was chosen to be approximately $10^{15}$ per cm$^3$ in the region 20. The transient time through this channel is then given by the saturation velocity divided into the channel width, and is one picosecond. The RC time constant corresponding to the change in the charging of the gate is 5 picoseconds calculated on the basis of the capacity of the Schottky barrier and the ridge edge radius.

The present switching device may be formed by a variety of fabrication techniques. The following technique is a preferred technique utilized by the Applicants. The first step in this technique is to start with a modulation-doped substrate. A variety of heteroepitaxial material couples may be utilized, such as GaAs on AlGaAs, Ge on GaAs, In$_{.53}$Ga$_{.47}$As on InP, GaAs on ZnSe, which have good lattice matches. In the example in FIG. 1, the substrate is n-doped AlGaAs, with shallow dopants such as selenium. Typically such a substrate may be formed by standard MBE techniques. In this regard, a substrate could be formed simply by utilizing an oven of Ga, an oven of As, an oven of Al, and an oven of a donor with a controlled shutter on the donor oven. The heated ovens then direct beams of their respective materials on to a surface to form a substrate. All four of the ovens including the donor over may be utilized initially to converge their beams to form the substrate crystals. Finally, for the last few tens of atomic layers of the substrate the shutter for the donor oven may be closed so that the last few substrate layers have no donors therein. Typically, this undoped layer portion should be to a depth of 50-100 angstroms in order to keep the charged donor atoms away from the critical portion of the channel. Alternative methods, such as organometallic chemical vapor deposition, may be used with laser simulation of growth to produce smooth abrupt interfaces without interdiffusion.

Figure 3D:
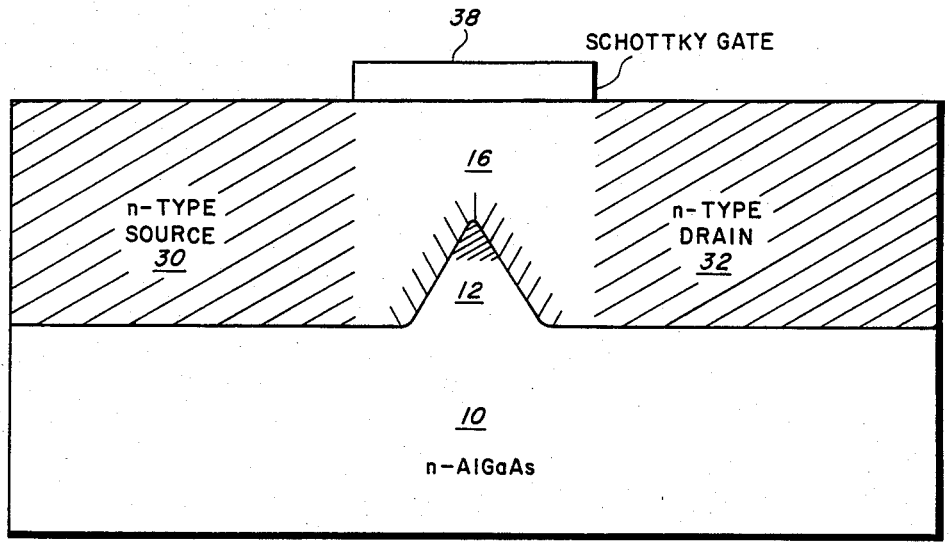
FIG. 3 (a) illustrates the lithographic formation step for the ridge structure of the present invention.
Figure 3E:
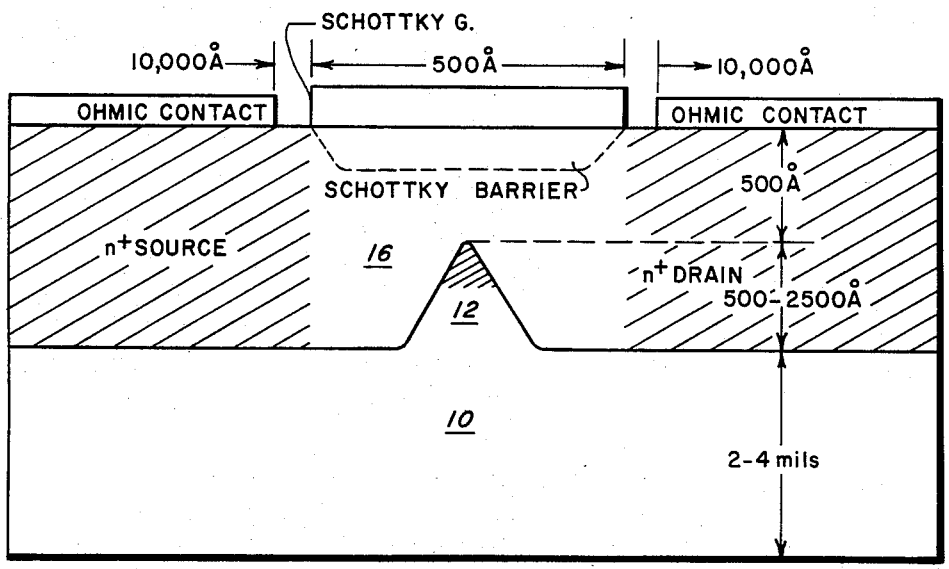

The next step is to use standard lithography techniques to form the ridge structure 12. In order to implement these techniques a substrate is utilized where the crystal lattice has its 100 direction in the vertical direction as shown in FIG. 3 (a). The first step in the lithographic technique is to place a masking line 60 of approximately 2000 angstroms on top of the modulation doped area of the substrate 10. Orient-dependent etching of the AlGaAs substrate is then accomplished using a standard etchant such KOH in H$_2$O or ethylene diamine pyrocatechol or hydrazine. As is well known in the art, the 100 direction etchs much faster than the 111 direction. Thus, a ridge structure 12 is formed as shown in FIG. 3 (b). Generally, the etching speed used is timed empirically. It should be noted that after this etching step, the only portion of the non-doped region of the substrate is in the area 22 at the apex of the ridge 12. The masking line is removed when the etch completes the under-cut process.

The next step is to cover the substrate including the ridge 12 with an epitaxial layer of semiconductor material. In the example of FIG. 1, in order to obtain the epitaxial heterojunction interface the material utilized was GaAs. This material may be applied using conventional MBE growth kinetic techniques. Typically, this layer may be on the order of 1000 angstroms. The MBE overgrowth of GaAs in the layer 16 is shown in FIG. 3 (c). It is well known in MBE technology that growth occurs tending to flatten the surface, so that an approximately flat film is obtained, as shown in FIG. 3c. Also, it is known that electropolishing with standard bromine-methanol etch may be used to obtain precise flatness.

In the preferred embodiment of FIG. 1, a Schottky gate 36 is formed on the GaAs layer 16 directly above the ridge structure 12. A wide variety of Schottky metalization may be utilized depending on the band structure desired relative to the semiconductor layer 16. By way of example, the Schottky metalization could be tungsten, iridium, or other refractory metals with high work functions such as platinum.

The next step is to implant the n-dopants to form the source and drain regions 30 and 32. This source and drain formation step typically may be accomplished by the ion implantation of an n-dopant such as Si in order to give the respective regions a very high conductivity with a low resistance. During this step the Schottky metalization layer 36 acts as a mask over the gate channel region to prevent ion implantation therein.

Finally, Ohmic metalization may be formed over the source and drain regions in order to form the source and drain contacts. By way of example, these metalization may be formed from aluminum.

For additional details on the fabrication techniques recited herein and on other techniques such as CVD and LPE which may be utilized, see *The Physics of Microfabrication*, Brodie and Muray, Plenum Press, 1982.

FIG. 3 (*e*) illustrates the switching device of the present invention with typical dimensions for the elements therein. The substrate thickness in the nonridge portion thereof may typically be from 0.2-0.4 mils. The ridge structure 12 may be on the order of 500-2500 angstroms. The thickness of the semiconductor layer 16 from the top of the ridge structure 12 to the top surface may be on the order of 500 angstroms. The Schottky barrier metalization layer may have a width of 500 angstroms while the ohmic contacts for the source and drain regions may have widths of 10,000 angstroms.

Although the nondoped region 22 was disposed only at the apex of the ridged structure 12 in the preferred embodiment, this nondoped region may also extend to follow the entire profile of the ridge structure 12 and possibly extend along the entire interface 14 between the substrate 10 and the semiconductor layer 16. This type of modulation doping configuration could be accomplished simply by starting with a fully doped substrate 10. etching the ridge 12, and then growing an additional 100 angstroms of undoped substrate material on top of the doped substrate material along its entire length.

It should be noted that it is possible to build the present switching device so that it is either normally on or normally off. Typically, the voltages applied to the Schottky gate 36 will be on the order of 1-5 volts. The polarity of the voltage will depend on where the Schottky barrier comes in relation to the apex of the ridge structure 12.

It should also be noted that it is possible to build the present switching device utilizing p type dopants. However such a p doped device will probably be slower since holes inherently move slower than electrons.

The present device is a low power signal processing switching device which is compatible with solid state fabrication technology, i.e. lithography, deposition techniques, etc. This device has an extremely short channel and a low transit time therethrough. The velocity of the carriers through the channel is extremely high in part because of the high quality of the epitaxial heterojunction GaAs/AlGaAs interface and because of the modulation doped substrate. These two features lead to a significant reduction in the scattering of carriers as they propagate through the channel. The low transit time is also due to the short current path in the channel.

It should also be noted that the present device has a very low gate capacitance set up between the gate electrode and the AlGaAs. This low capacitance results because the capacitance can only be formed between the gate electrode and the apex of the ridge structure 12. Thus, the device has a very low RC time constant.

Finally, it should be noted that due to the sharpness of the edge of the ridge structure 12, there is additional sensitivity to the gate voltage, which leads to higher gain on amplification.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A semiconductor switching device including in combination:
    a doped semiconductor substrate of the first conductivity type and of a first material with one surface thereof being approximately flat but with a ridge structure rising from a portion of said flat surface;
    a semiconductor layer of a second material disposed over the flat surface and ridge structure of said substrate to form an epitaxial heterojunction interface therewith, heavily doped source and drain regions of the first conductivity type being formed down into said semiconductor layer on opposite sides of said ridge structure;
    source and drain ohmic contacts being disposed on said semiconductor layer above said source and drain regions;
    a gate material being disposed on said semiconductor layer above said substrate ridge structure to form a barrier with said semiconductor layer.

2. A switching device as defined in claim 1, wherein a portion of said ridge structure is modulation doped.

3. A switching device as defined in claim 2, wherein said modulation doped portion of the ridge structure is the area around the apex of the ridge structure.

4. A switching device as defined in claim 3, wherein said gate material is Schottky-barrier material.

5. A switching device as defined in claim 4, wherein said ridge structure is formed by an approximately V-shaped ridge.

6. A switching device as defined in claim 5, wherein said semiconductor substrate is AlGaAs with n-type dopants.

7. A switching device as defined in claim 6, wherein said semiconductor layer is GaAs and said source and drain regions are doped with n-type dopants.

8. A switching device as defined in claim 2, wherein said modulation-doped portion of the ridge structure comprises an outer layer following the profile of said ridge structure.

9. A field-effect transistor including in combination:
    a semiconductor substrate of the first conductivity type and of a first material with one surface thereof being approximately flat but with a ridge structure rising from a portion of said flat surface, said ridge structure being modulation-doped along an edge portion thereof;
    a semiconductdor layer of a second material disposed over the flat surface and ridge structure of said substrate to form an epitaxial heterojunction interface therewith, heavily doped source and drain regions of the first conductivity type being formed in said semiconductor layer on opposite sides of said ridge structure essentially down to said substrate.
    source and drain ohmic contacts being disposed on said semiconductor layer above said source and drain regions; and
    a Schottky-barrier material being disposed on said semiconductor layer above said substrate ridge structure to form a gate contact.

10. An FET as defined in claim 9, wherein said portion of said ridge structure which is modulation doped is the apex area thereof.

11. An FET as defined in claim 10, wherein said substrate ridge structure rises from said flat surface to form an approximate V-shaped ridge.

* * * * *